US010067195B2

(12) United States Patent
Chiyajo et al.

(10) Patent No.: US 10,067,195 B2
(45) Date of Patent: Sep. 4, 2018

(54) VOLTAGE DETECTION UNIT

(71) Applicant: Yazaki Corporation, Tokyo (JP)

(72) Inventors: Yuki Chiyajo, Shizuoka (JP); Hidehiko Shimizu, Shizuoka (JP); Yasutaka Wakasugi, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 518 days.

(21) Appl. No.: 14/965,422

(22) Filed: Dec. 10, 2015

(65) Prior Publication Data

US 2016/0097817 A1 Apr. 7, 2016

Related U.S. Application Data

(63) Continuation of application No. PCT/JP2014/065745, filed on Jun. 13, 2014.

(30) Foreign Application Priority Data

Jun. 19, 2013 (JP) .................. 2013-128879

(51) Int. Cl.
*G01R 31/36* (2006.01)
*H05K 1/02* (2006.01)
*G01R 15/16* (2006.01)
*G01R 19/00* (2006.01)
*G01R 31/44* (2006.01)
(Continued)

(52) U.S. Cl.
CPC ......... *G01R 31/3658* (2013.01); *G01R 15/16* (2013.01); *G01R 19/00* (2013.01); *G01R 19/0084* (2013.01); *G01R 31/44* (2013.01); *H05K 1/0224* (2013.01);
(Continued)

(58) Field of Classification Search
CPC .... G01R 31/3658; G01R 15/16; G01R 19/00; G01R 19/0084; G01R 31/44; G01R 19/16542; H05K 1/0224; H05K 1/0253; H05K 1/0254; H05K 1/162
See application file for complete search history.

(56) References Cited

U.S. PATENT DOCUMENTS

2008/0087458 A1   4/2008   Hattori et al.
2010/0172770 A1   7/2010   Ichise et al.
(Continued)

FOREIGN PATENT DOCUMENTS

JP    2002-280678 A    9/2002
JP    2002-368355 A    12/2002
(Continued)

OTHER PUBLICATIONS

International Search Report of PCT/JP2014/065745 dated Aug. 26, 2014 [PCT/ISA/210].

*Primary Examiner* — Son Le
*Assistant Examiner* — Adam Clarke
(74) *Attorney, Agent, or Firm* — Sughrue Mion, PLLC (57) ABSTRACT

A first pattern and a second pattern are stacked with each other. In a pattern of a first circuit for high voltage, a GND is formed as a solid pattern. In a pattern of a second circuit for low voltage, a GND is formed as a solid pattern. The solid pattern of the GND of the pattern of the first circuit for high voltage and the solid pattern of the GND of the pattern of the second circuit for low voltage partially face each other, thereby improving noise-resistant performance of the circuit for high voltage.

5 Claims, 9 Drawing Sheets (51) Int. Cl.
*G01R 19/165* (2006.01)
*H05K 1/16* (2006.01)

(52) U.S. Cl.
CPC ...... *G01R 19/16542* (2013.01); *H05K 1/0253* (2013.01); *H05K 1/0254* (2013.01); *H05K 1/162* (2013.01)

(56) References Cited

U.S. PATENT DOCUMENTS

| | | | | |
|---|---|---|---|---|
| 2011/0199741 | A1* | 8/2011 | Yokonuma | H05K 1/028 361/749 |
| 2012/0212305 | A1* | 8/2012 | Shafer | H03H 7/0153 333/174 |
| 2013/0076129 | A1 | 3/2013 | Kunimitsu et al. | |
| 2013/0222045 | A1* | 8/2013 | Wu | H01L 25/074 327/419 |
| 2013/0321003 | A1* | 12/2013 | Shimizu | G01R 27/2605 324/663 |
| 2014/0060892 | A1* | 3/2014 | Katayama | H05K 1/0271 174/250 |

FOREIGN PATENT DOCUMENTS

| | | |
|---|---|---|
| JP | 2009-114961 A | 5/2009 |
| JP | 2011-023384 A | 2/2011 |
| JP | 2011-229397 A | 11/2011 |
| JP | 2012-199483 A | 10/2012 |
| JP | 2013-072817 A | 4/2013 |

* cited by examiner

FIG.1A

| 10, 20 | PATTERN |
| 100, 200 | CIRCUIT FOR HIGH VOLTAGE |
| 150, 200 | CIRCUIT FOR LOW VOLTAGE |
| 103, 253 | GND |

VOLTAGE DETECTION UNIT

CROSS-REFERENCE TO RELATED APPLICATION

This application is a continuation application of International Application PCT/JP2014/065745, filed on Jun. 13, 2014, and designating the U.S., the entire contents of which are incorporated herein by reference.

BACKGROUND OF THE INVENTION

1. Field of the Invention

The present invention relates to a voltage detection unit including a circuit board formed with circuits for low voltage and circuits for high voltage.

2. Description of the Related Art

Some recent vehicles mount a cell pack in which secondary cells are connected in series. A voltage detection unit that detects an output voltage of each secondary cell is used in order to measure electric power output by the cell pack.

Figure 7:
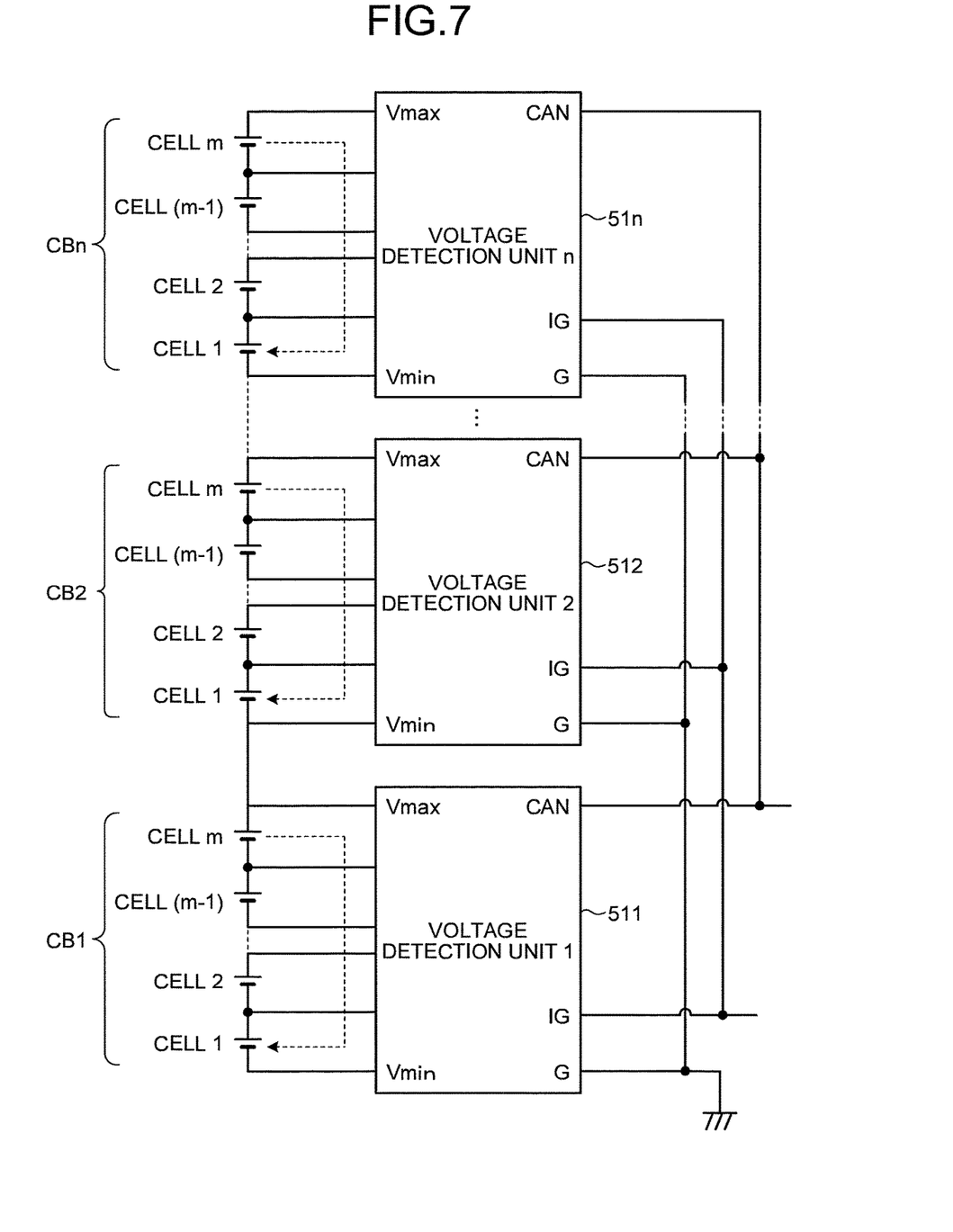
FIG. 7 is a circuit diagram illustrating a state in which voltage detection units are used for secondary cells.

FIG. 7 is a circuit diagram illustrating a state in which voltage detection units are used for secondary cells.

As illustrated in FIG. 7, a cell pack includes secondary cell blocks CB1, CB2, . . . , and CBn connected in series. Voltage detection units 511, 512, . . . , and 51n are connected to the secondary cell blocks CB1, CB2, . . . , and CBn, respectively, and the voltage detection units 511, 512, . . . , and 51n detect output voltages of the corresponding secondary cell blocks CB1, CB2, . . . , and CBn, respectively.

Figure 8:
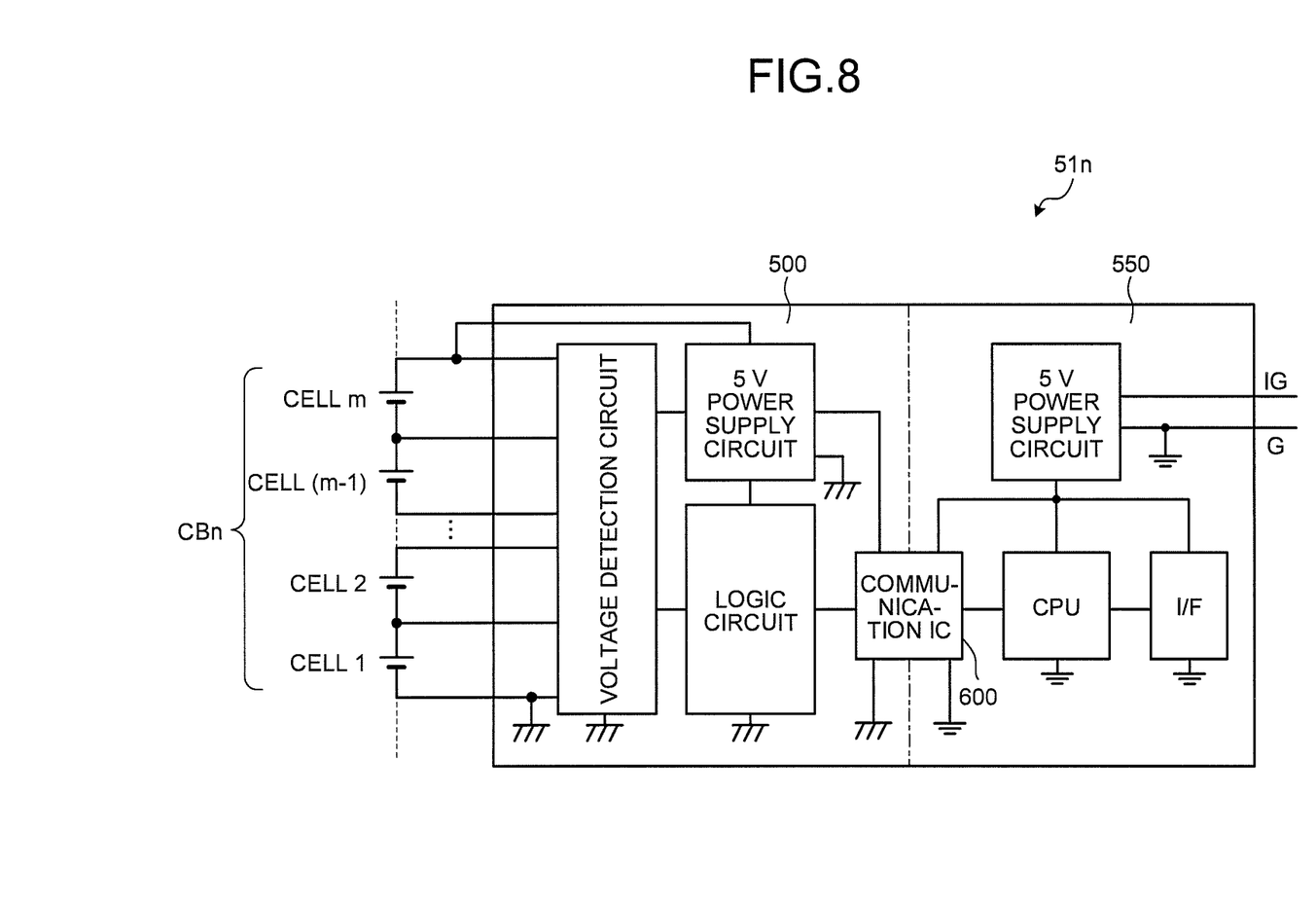
FIG. 8 is an equivalent circuit of a circuit board of a conventional voltage detection unit.

FIG. 8 is an equivalent circuit of a circuit board of a conventional voltage detection unit.

In the voltage detection unit 51n, schematically two circuits are provided on the circuit board. One circuit is a circuit 500 for high voltage, and the other circuit is a circuit 550 for low voltage. Japanese Patent Application Laid-open No. 2011-229397 discloses a circuit board provided with a circuit for high voltage and a circuit for low voltage.

The circuit 500 for high voltage illustrated in FIG. 8 is connected to the secondary cell block CBn as a high-voltage power supply, and a voltage detection circuit detects voltages of a cell 1, a cell 2, . . . , and a cell m constituting the secondary cell block CBn. The voltage detection circuit outputs the detected voltages to a logic circuit to be driven by receiving voltage (electric power) from a 5 V power supply circuit. The 5 V power supply circuit, to which the voltage of the secondary cell block CBn is applied, supplies a rated voltage of 5 V to the logic circuit and a communication IC. The logic circuit converts the voltages of the cell 1 to the cell m input from the voltage detection circuit into binary signals and outputs the binary signals to the communication IC 600.

A 5 V power supply circuit of the circuit 550 for low voltage illustrated in FIG. 8, to which electric power is supplied from a vehicle's battery, supplies electric power with a rated voltage of 5 V to the logic circuit and the communication IC. A CPU receives signals from the communication IC 600, performs various kinds of operations, and outputs resultant output signals to an I/F.

The voltage detection unit 51n illustrated in FIG. 8 requires to take measures against the following matter. Specifically, the communication IC 600 that relays transmission and reception of signals between the circuit 500 for high voltage and the circuit 550 for low voltage is required to operate at a high clock frequency, and measures are required to be taken against harmonic noise that occurs at the communication IC 600 propagating therefrom to the circuit 500 for high voltage and the circuit 550 for low voltage.

As an example of the measures, a ground (hereinafter, referred to as a GND) in the pattern of the circuit 550 for low voltage is formed as a solid pattern (Japanese Patent Application Laid-open No. 2002-368355 discloses that the GND is formed as the solid pattern, for example).

Figure 9:
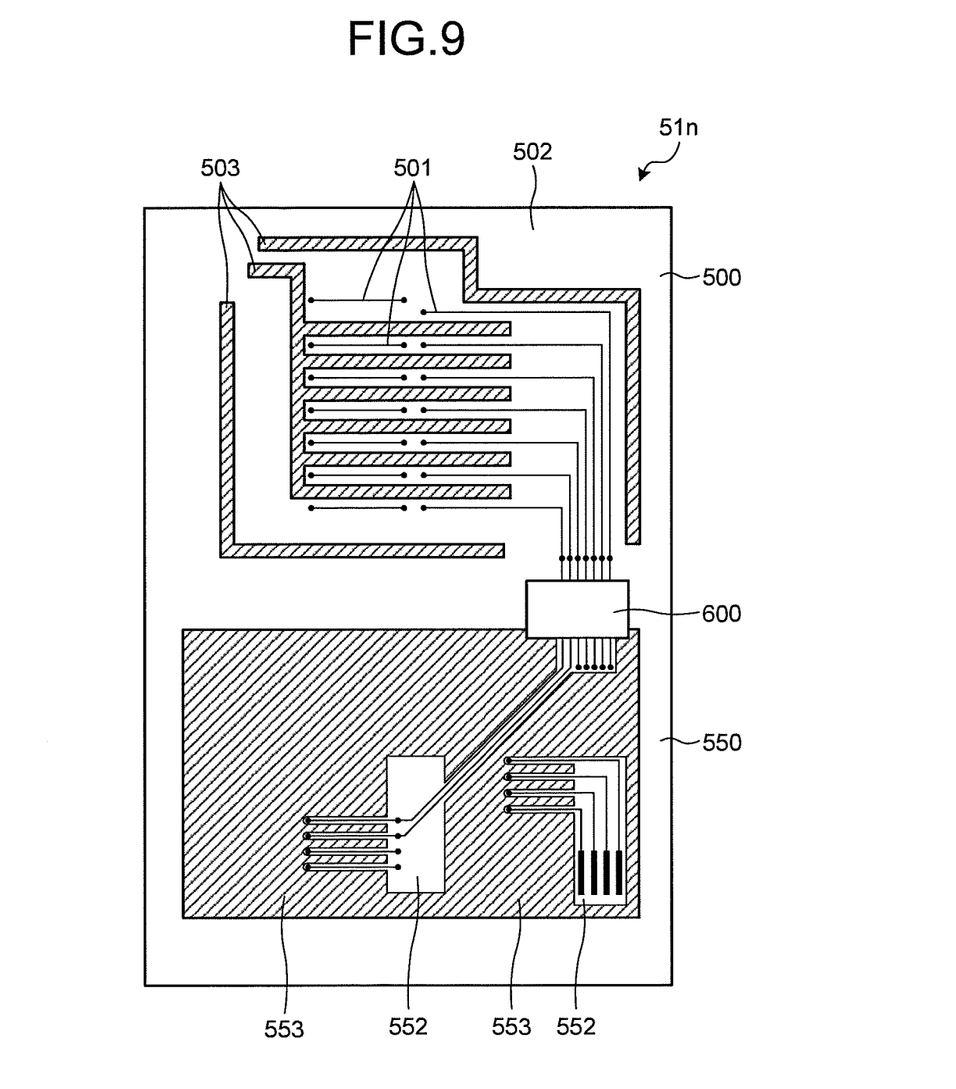
FIG. 9 is a circuit diagram of the circuit board of the conventional voltage detection unit.

FIG. 9 is a circuit diagram of the circuit board of a conventional voltage detection unit.

In the pattern of the circuit 550 for low voltage in FIG. 9, a GND 553 is formed as a solid pattern on the surface of a substrate except parts formed with a signal line 551 and an insulating part 552. By thus forming the GND 553 of the circuit 550 for low voltage as the solid pattern and capacitively coupling the signal line 551 and the GND 553, noise-resistance performance of the circuit 550 for low voltage against harmonic noise radiated from the communication IC 600 can be increased.

The circuit board of the conventional voltage detection unit in FIG. 9 takes no measures for the circuit 500 for high voltage. In other words, in FIG. 9, in the circuit 500 for high voltage, GNDs 503 are formed on the circuit board as thin patterns (lines), and insulation between the GNDs 503 and signal lines 501 is achieved by an insulating part 502. Although it can be considered that the GNDs 503 in the pattern of the circuit 500 for high voltage are formed as a solid pattern similarly to the circuit 550 for low voltage, it is generally considered that this measure is not effective. This is because, as illustrated in FIG. 8, the circuit 550 for low voltage causes the GND 553 to be conductively connected to a vehicle's body ground to stabilize its GND level to be zero, whereas the circuit 500 for high voltage causes the GNDs 503 to be connected to lowest potential of the secondary cell block CBn to make its GND level the lowest potential (a finite value). This fact means that the GND level of the circuit 500 for high voltage fluctuates depending on the state of the secondary cell block CBn. The circuit 500 for high voltage, the GND level of which is thus not stable, is questionable in noise-resistant performance, even if the GNDs 503 of the circuit 500 for high voltage are formed as the solid pattern. For this reason, the circuit 500 for high voltage with the GNDs 503 formed as the solid pattern has not been employed.

SUMMARY OF THE INVENTION

The present invention has been made in view of the above-described situation. An object the present invention is to provide a voltage detection unit with circuits for high voltage improved in noise-resistant performance.

In order to solve the above mentioned problem and achieve the object, a voltage detection unit according to one aspect of the present invention includes a first pattern formed with a pattern of a first circuit for high voltage and a pattern of a first circuit for low voltage; and a second pattern formed with a pattern of a second circuit for high voltage and a pattern of a second circuit for low voltage. Here, the first pattern and the second pattern are stacked with each other. In the pattern of the first circuit for high voltage, a GND is formed as a solid pattern except on parts formed with signal lines and insulating parts. In the pattern of the second circuit for low voltage, a GND is formed as a solid pattern except on parts formed with signal lines and insulating parts. The solid pattern of the GND of the pattern of the first circuit for high voltage and the solid pattern of the GND of the pattern of the second circuit for low voltage partially face each other in a stacking direction in which the first pattern and the second pattern are stacked with each other.

Further, in the voltage detection unit according to another aspect of the present invention, it is preferable that in the pattern of the first circuit for low voltage, a GND is formed as a solid pattern except on parts formed with signal lines and insulating parts. In the pattern of the second circuit for high voltage, a GND is formed as a solid pattern except on parts formed with signal lines and insulating parts.

Further, in the voltage detection unit according to still another aspect of the present invention, it is preferable that the pattern of the first circuit for high voltage and the pattern of the second circuit for high voltage are formed at positions facing each other in the stacking direction. The pattern of the first circuit for low voltage and the pattern of the second circuit for low voltage are formed at positions facing each other in the stacking direction. In the pattern of the first circuit for high voltage, the solid pattern of the GND comprises a solid pattern body facing the pattern of the second circuit for high voltage and a solid pattern extension extending from the solid pattern body toward the pattern of the first circuit for low voltage. In the pattern of the first circuit for low voltage, the solid pattern of the GND is formed with a notch inside which a part of the solid pattern extension is provided. The solid pattern extension of the pattern of the first circuit for high voltage and the solid pattern of the GND of the pattern of the second circuit for low voltage partially face each other in the stacking direction.

Further, in the voltage detection unit according to still another aspect of the present invention, it is preferable that in the pattern of the first circuit for low voltage, the solid pattern of the GND comprises a body ground connecting part conductively connected to a body ground of a vehicle, and the notch is provided near the body ground connecting part.

Further, in the voltage detection unit according to still another aspect of the present invention, it is preferable that the voltage detection unit further includes a communication IC which is disposed on the first pattern or the second pattern and is connected to signal lines of a pattern of a circuit for low voltage and signal lines of a pattern of a circuit for high voltage. Here, the solid pattern extension is provided near the communication IC.

With the configurations of the voltage detection unit described above, the voltage detection unit can capacitively couple the pattern of the first circuit for high voltage and the GND of the second circuit for low voltage.

The present invention has been briefly described. In addition, details of the present invention will be further clarified by reading through Description of Embodiments (hereinafter, referred to as "embodiments") described below with reference to the attached drawings.

DETAILED DESCRIPTION OF THE PREFERRED EMBODIMENTS

The following describes specific embodiments related to the present invention with reference to the drawings.

Figure 1A:
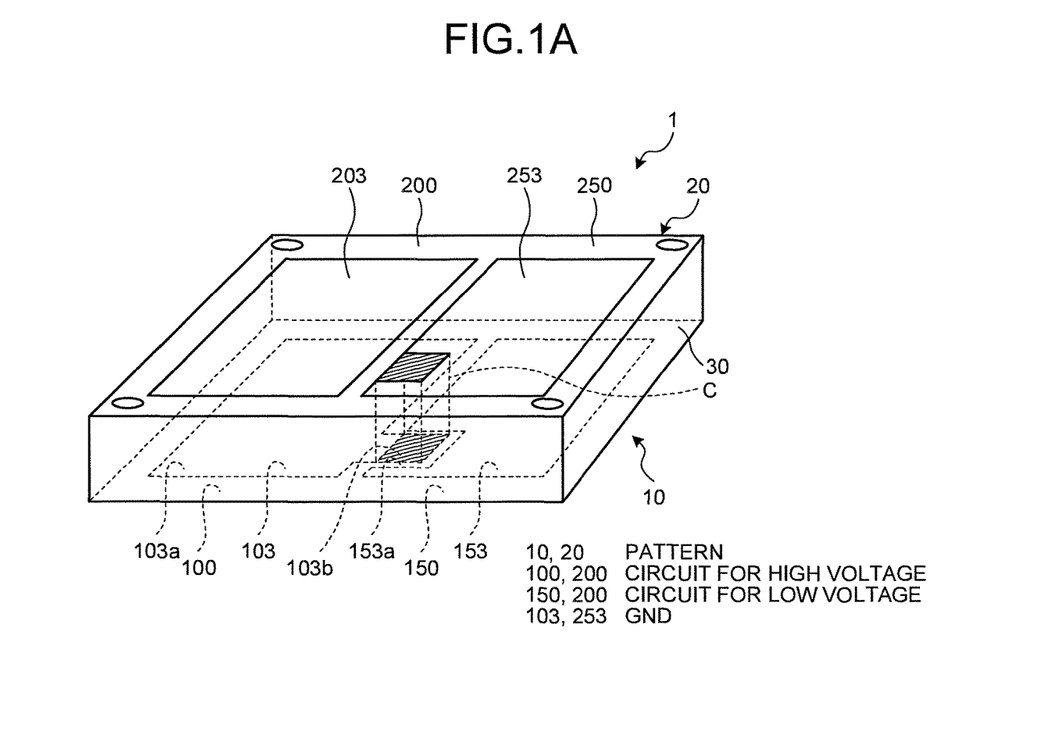
FIG. 1A and FIG. 1B are diagrams of a circuit board of a voltage detection unit as an embodiment of the present invention (FIG. 1A is a perspective view, FIG. 1B is a sectional view at a section passing through a solid pattern extension)
Figure 1B:
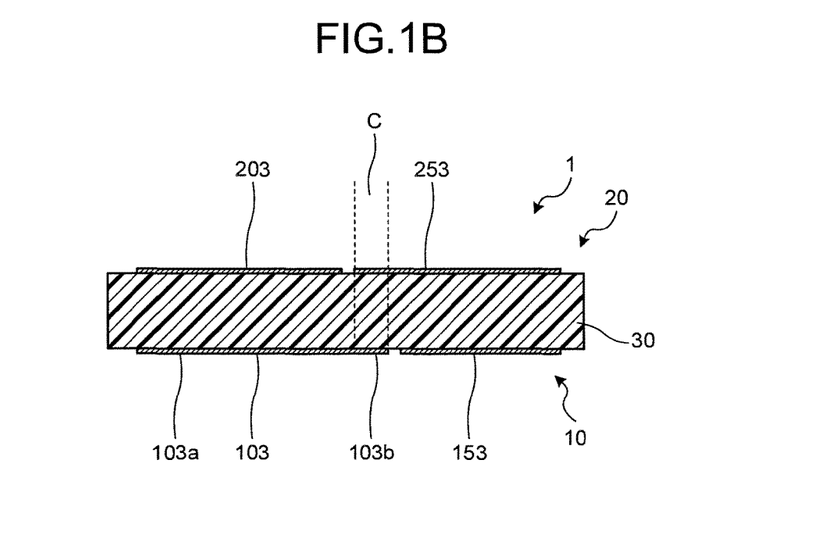
Figure 2A:
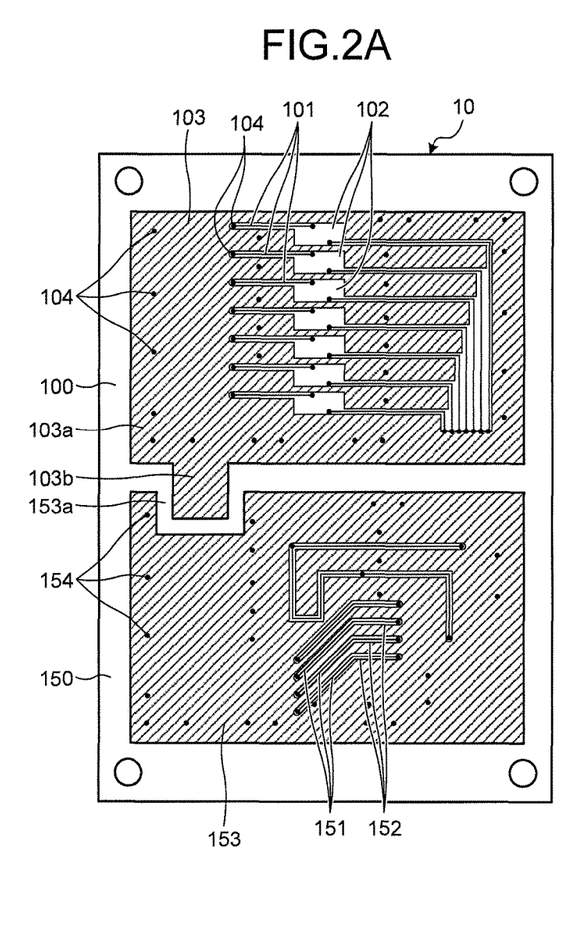
FIG. 2A and FIG. 2B are plan views of the layers of the circuit board of the voltage detection unit as the embodiment of the present invention (FIG. 2A is a plan view viewing a first-layer pattern from above, FIG. 2B is a plan view viewing a second-layer pattern from above)
Figure 2B:
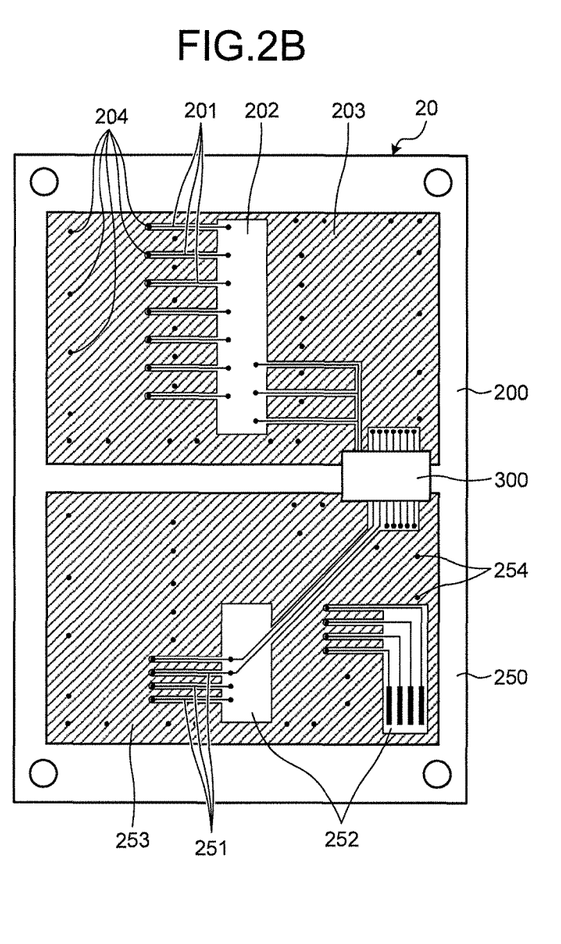
Figure 3:
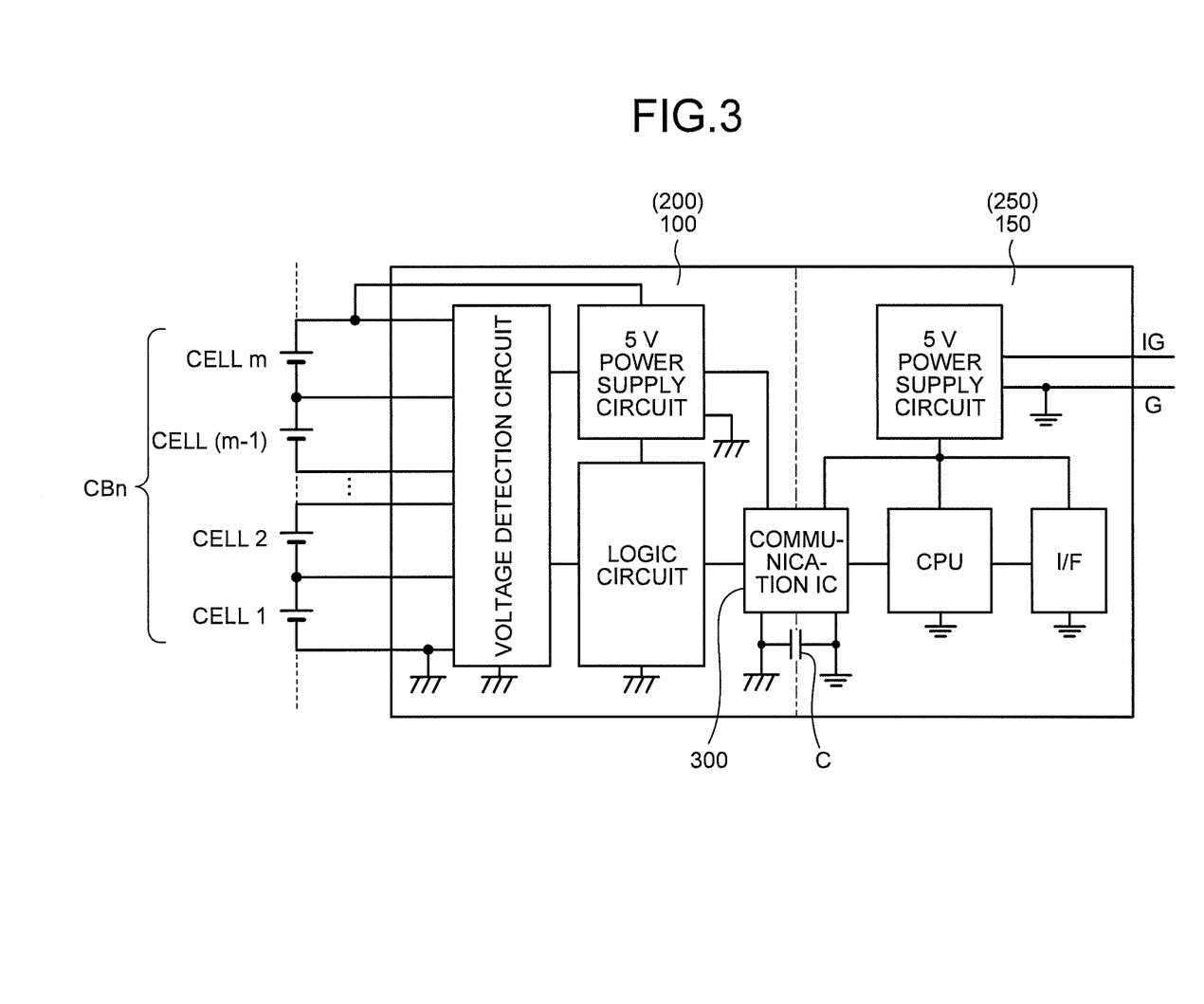
FIG. 3 is an equivalent circuit of the circuit board of the voltage detection unit as the embodiment of the present invention.

FIG. 1A and FIG. 1B are diagrams of a circuit board of a voltage detection unit as an embodiment of the present invention: FIG. 1A is a perspective view; FIG. 1B is a sectional view at a part passing through a solid pattern extension. FIG. 2A and FIG. 2B are plan views of the layers of the circuit board of the voltage detection unit as the embodiment of the present invention: FIG. 2A is a plan view viewing a first-layer pattern from above (the upper direction in FIG. 1B); FIG. 2B is a plan view viewing a second-layer pattern from above (the upper direction in FIG. 1B). FIG. 3 is an equivalent circuit of the circuit board of the voltage detection unit as the embodiment of the present invention.

The voltage detection unit of the embodiment of the present invention includes a circuit board 1 in which patterns 10 and 20 are stacked with each other. As illustrated in FIG. 1, the circuit board 1 has a stacked structure with the pattern 10 as a lower layer and with the pattern 20 as an upper layer. The circuit board 1 is a multilayer board in which the patterns 10 and 20 are stacked with each other through a cured resin layer (prepreg) 30. Hereinafter, the pattern 10 may be referred to as a first-layer pattern 10, and the pattern 20 may be referred to as a second-layer pattern 20.

The pattern 10 is formed of a copper foil laminated on the surface of a plate-shaped substrate formed of a glass-fiber-attached resin, for example. As illustrated in FIG. 1A and FIG. 2A, the pattern 10 is formed with a pattern of a circuit 100 for high voltage and a pattern of a circuit 150 for low voltage. The pattern of the circuit 100 for high voltage of the pattern 10 is formed with signal lines 101 and a GND 103 as the pattern. The GND 103 is formed as a solid pattern on the surface of the substrate except parts formed with the signal lines 101 and insulating parts 102. The signal lines 101 and the GND 103 are insulated from each other by the insulating parts 102. The pattern of the circuit 100 for high voltage is formed with via holes 104 on the signal lines 101 and the GND 103.

As illustrated in FIG. 1A and FIG. 2A, the pattern of the circuit 150 for low voltage of the pattern 10 is formed with signal lines 151, insulating parts 152, and a GND 153 as the pattern. The GND 153 is formed as a solid pattern on the surface of the substrate except parts formed with the signal lines 151 and the insulating parts 152. The signal lines 151 and the GND 153 are insulated from each other by the insulating parts 152. The pattern of the circuit 150 for low voltage is formed with via holes 154 on the signal lines 151 and the GND 153.

Similarly, the pattern 20 is formed of a copper foil laminated on the surface of a plate-shaped substrate formed of a glass-fiber-attached resin, for example. As illustrated in FIG. 1A and FIG. 2A, the pattern 20 is formed with a pattern of a circuit 200 for high voltage and a pattern of a circuit 250 for low voltage. The pattern of the circuit 200 for high voltage of the pattern 20 is formed with signal lines 201, insulting parts 202, and a GND 203 as the pattern. The GND 203 is formed as a solid pattern on the surface of the substrate except parts formed with the signal lines 201 and the insulating parts 202. The signal lines 201 and the GND 203 are insulated from each other by the insulating parts 202. The pattern of the circuit 200 for high voltage is formed with via holes 204 on the signal lines 201 and the GND 203.

As illustrated in FIG. 1A and FIG. 2B, the pattern of the circuit 250 for low voltage of the pattern 20 is formed with signal lines 251, insulating parts 252, and a GND 253 as the pattern. The GND 253 is formed as a solid pattern on the surface of the pattern 20 except parts formed with the signal lines 251 and the insulating parts 252. The signal lines 251 and the GND 253 are insulated from each other by the insulating parts 252. The pattern of the circuit 250 for low voltage is formed with via holes 254 on the signal lines 251 and the GND 253.

The pattern 20 is provided with a communication IC 300 so as to connect the pattern of the signal lines 201 of the circuit 200 for high voltage and the pattern of the signal lines 251 of the circuit 250 for low voltage. The communication IC 300 relays transmission and reception of signals between the circuits 100 and 200 for high voltage and the circuits 150 and 250 for low voltage.

In FIG. 1B, in the pattern 10, the face formed with the pattern of the circuit 100 for high voltage and the pattern of the circuit 150 for low voltage faces downward in the stacking direction, and in the pattern 20, the face formed with the pattern of the circuit 200 for high voltage and the pattern of the circuit 250 for low voltage faces upward in the stacking direction. The pattern of the circuit 100 for high voltage of the pattern 10 and the pattern of the circuit 200 for high voltage of the pattern 20 are formed at positions facing each other in the stacking direction, and the pattern of the circuit 150 for low voltage of the pattern 10 and the pattern of the circuit 250 for low voltage of the pattern 20 are formed at positions facing each other in the stacking direction.

In the patterns 10 and 20 formed in the stacked structure, conductive vias (not illustrated) are inserted into the via holes 104 and 204 of the facing patterns of the circuits 100 and 200 for high voltage, respectively. With this structure, when the via holes 104 are pierced on the signal lines 101 and when the via holes 204 are pierced on the signal lines 201, the signal lines 101 and the signal lines 201 are conductively connected to each other. When the via holes 104 are pierced on the GND 103 and when the via holes 204 are pierced on the GND 203, the GND 103 and the GND 203 are conductively connected to each other.

Similarly, in the patterns 10 and 20 formed in the stacked structure, conductive vias (not illustrated) are inserted into the via holes 154 and 254 of the patterns of the circuits 150 and 250 for low voltage, respectively, facing each other in the stacking direction. With this structure, when the via holes 154 are pierced on the signal lines 151 and when the via holes 254 are pierced on the signal lines 251, the signal lines 151 and the signal lines 251 are conductively connected to each other. When the via holes 154 are pierced on the GND 153 and when the via holes 254 are pieced on the GND 253, the GND 153 and the GND 253 are conductively connected to each other.

The shapes of the GND 103 of the pattern of the circuit 100 for high voltage and the GND 153 of the pattern of the circuit 150 for low voltage in the pattern 10 are different from the shapes of the GND 203 of the pattern of the circuit 200 for high voltage and the GND 253 of the pattern of the circuit 250 for low voltage in the pattern 20.

In other words, as illustrated in FIG. 2, in the pattern of the circuit 100 for high voltage, the solid pattern of GND 103 includes a solid pattern body 103a facing the pattern of the circuit 200 for high voltage and a solid pattern extension 103b extending from the solid pattern body 103a toward the pattern of the circuit 150 for low voltage. The solid pattern body 103a has substantially the same shape as that of the rectangular GND 203 formed as the solid pattern in the pattern of the circuit 200 for high voltage. The solid pattern extension 103b has a rectangular shape smaller than the solid pattern body 103a.

In the pattern of the circuit 150 for low voltage, the solid pattern of the GND 153 is formed with a notch 153a inside which a part of the solid pattern extension 103b is provided. Although the solid pattern of the GND 153 has substantially the same shape as that of the rectangular GND 253 formed as the solid pattern in the pattern of the circuit 250 for low voltage as a whole, a part thereof is notched. A part of the solid pattern extension 103b is provided inside the notch 153a.

The thus formed solid pattern extension 103b of the pattern of the circuit 100 for high voltage partially faces the solid pattern of the GND 253 of the circuit 250 for low voltage in the stacking direction. In FIG. 1A, the part facing the GND 253 of the pattern of the circuit 250 for low voltage in the solid pattern extension 103b and the part facing the solid pattern extension 103b in the GND 253 of the pattern of the circuit 250 for low voltage are hatched.

The following then describes operations and effects by the voltage detection unit of the embodiment of the present invention described above.

In the voltage detection unit of the embodiment of the present invention, the solid pattern of the GND 103 of the pattern of the circuit 100 for high voltage and the solid pattern of the GND 253 of the pattern of the circuit 250 for low voltage partially face each other in the stacking direction in which the patterns 10 and 20 are stacked with each other. With this structure, capacitive coupling occurs between the GND 103 and the GND 253 positioned at the facing partial part.

The following describes an effect by the capacitive coupling with reference to FIG. 3.

The circuits 100 and 200 for high voltage illustrated in FIG. 3 are connected to the secondary cell block CBn as a high-voltage power supply, and a voltage detection circuit detects voltages of a cell 1, a cell 2, . . . , and a cell m constituting the secondary cell block CBn. The voltage detection circuit outputs the detected voltages of the cell 1, the cell 2, . . . , and the cell m to a logic circuit to be driven by receiving electric power from a 5 V power supply circuit. The 5 V power supply circuit, to which the voltage of the secondary cell block CBn is applied and electric power is supplied, supplies electric power having a rated voltage of 5 V to the logic circuit and the communication IC 300. The logic circuit converts the input voltages of the cell 1, the cell 2, ..., and the cell m into binary signals and outputs the binary signals to the communication IC 300. Although not illustrated in FIG. 2A and FIG. 2B, the voltage detection circuit, the 5 V power supply circuit, and the logic circuit are circuits that are mounted on the circuit board 1 using the pattern of the circuit 100 for high voltage or the pattern of the circuit 200 for high voltage.

A 5 V power supply circuit of the circuits 150 and 250 for low voltage illustrated in FIG. 3, to which voltage of a vehicle's battery is applied and electric power is supplied, supplies electric power having a rated voltage of 5 V to the logic circuit and the communication IC 300. A CPU receives signals including binary signals input from the communication IC 300, performs various kinds of operations, and outputs resultant output signals to an I/F. Although not illustrated in FIG. 2A and FIG. 2B, the 5 V power supply circuit, the CPU, and the I/F are circuits that are mounted on the circuit board 1 using the pattern of the circuit 150 for low voltage or the pattern of the circuit 250 for low voltage.

The capacitive coupling occurring between the GND 103 and the GND 253 is expressed as a capacitor C in the equivalent circuit in FIG. 3. The capacitor C functions as a filter, thereby cutting off harmonic noise radiated from the communication IC 300 toward the pattern of the circuit 100 for high voltage or the pattern of the circuit 200 for high voltage by the capacitor C. Consequently, noise-resistant performance of the circuit 100 for high voltage or the circuit 200 for high voltage against the harmonic noise radiated from the communication IC 300 can be increased. One end of the capacitor C illustrated in FIG. 3 is connected to the GND 253 that is conductively connected to a vehicle's body ground. The capacitor C is connected to the GND 253, the GND level of which is stable, in a high frequency manner, and the circuit 100 for high voltage or the circuit 200 for high voltage can exhibit favorable noise-resistant performance.

In the voltage detection unit of the embodiment of the present invention, the GND 103 in the pattern of the circuit 100 for high voltage is formed as the solid pattern, and the GND 203 in the pattern of the circuit 200 for high voltage is formed as the solid pattern. The capacitor C illustrated in FIG. 3 is connected to the GND 253, the GND level of which is stable, in a high frequency manner, and it can be said that an environment is ready in which pieces of capacitive coupling between the signal lines 101 and the GND 103 and between the signal lines 201 and the GND 203 can also function as a filter. Consequently, the solid patterns of the GND 103 and the GND 203 also contribute to an increase in the noise-resistant performance of the circuits 100 and 200 for high voltage against the harmonic noise radiated from the communication IC 300.

In the voltage detection unit of the embodiment of the present invention, the GND 153 in the pattern of the circuit 150 for low voltage is formed as the solid pattern, and the GND 253 in the pattern of the circuit 250 for low voltage is formed as the solid pattern. The solid patterns of the GND 153 and the GND 253 contribute to an increase in the noise-resistant performance of the circuits 150 and 250 for low voltage against the harmonic noise radiated from the communication IC 300.

As described above, the voltage detection unit of the embodiment of the present invention can increase the noise-resistant performance of the circuits 100 and 200 for high voltage and the circuits 150 and 250 for low voltage against the harmonic noise radiated from the communication IC 300.

The embodiment describes a form in which the solid pattern extension 103b is provided in the GND 103 of the circuit 100 for high voltage, and the notch 153a is provided in the GND 153 of the circuit 150 for low voltage. As another form, the solid pattern extension may be provided in the GND 203 of the circuit 200 for high voltage, and the notch may be provided in the GND 253 of the circuit 250 for low voltage. As still another form, the solid pattern extension may be provided in the GND 153 of the circuit 150 for low voltage, and the notch may be provided in the GND 103 of the circuit 100 for high voltage, thus reversing the positional relation between the projection and depression provided in the GND 103 and the GND 153. These other forms produce an effect similar to that of the embodiment.

The present invention does not limit the positions at which the solid pattern extension 103b and the notch 153a are provided to the positions illustrated in FIG. 1A and FIG. 2A. The solid pattern extension 103b and the notch 153a may be provided at any positions so long as the condition is satisfied that the solid patterns of the GNDs 103 and 203 of the patterns of the circuits 100 and 200 for high voltage, respectively, and the solid patterns of the GNDs 153 and 253 of the patterns of the circuits 150 and 250 for low voltage, respectively, partially face each other. However, the positions at which the solid pattern extension 103b and the notch 153a are provided are preferably designed in consideration of the following point.

Figure 4A:
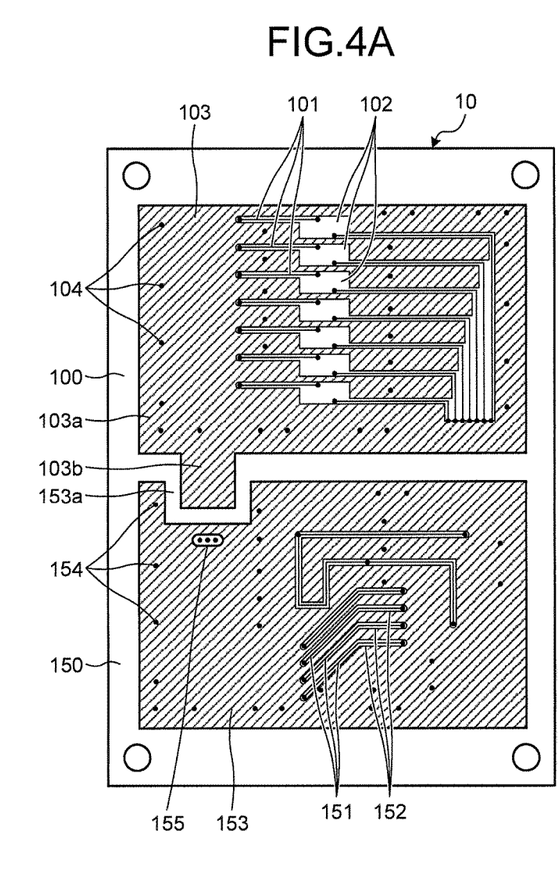
FIG. 4A and FIG. 4B are plan views of layers of a circuit board of a voltage detection unit as another embodiment of the present invention (FIG. 4A is a plan view viewing a first-layer pattern from above, FIG. 4B is a plan view viewing a second-layer pattern from above)
Figure 4B:
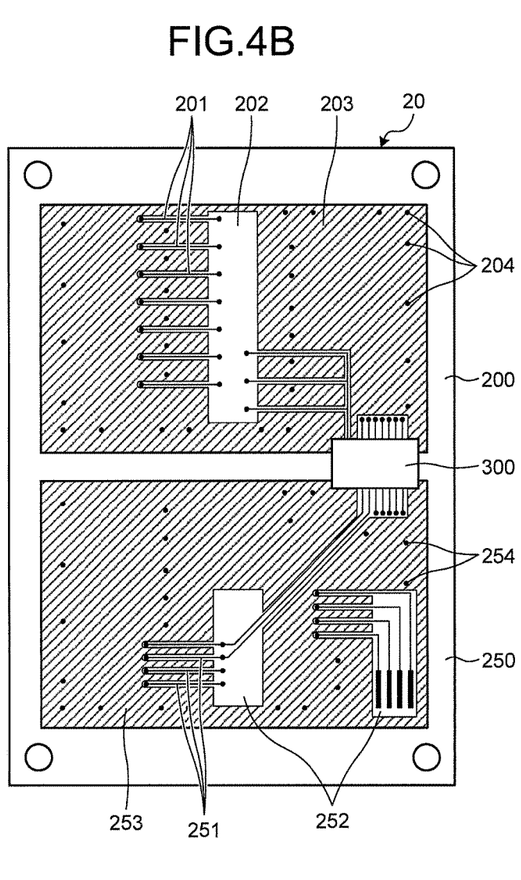

FIG. 4A and FIG. 4B are plan views of layers of a circuit board of a voltage detection unit as another embodiment of the present invention: FIG. 4A is a plan view viewing a first-layer pattern from above; FIG. 4B is a plan view viewing a second-layer pattern from above.

Figure 5A:
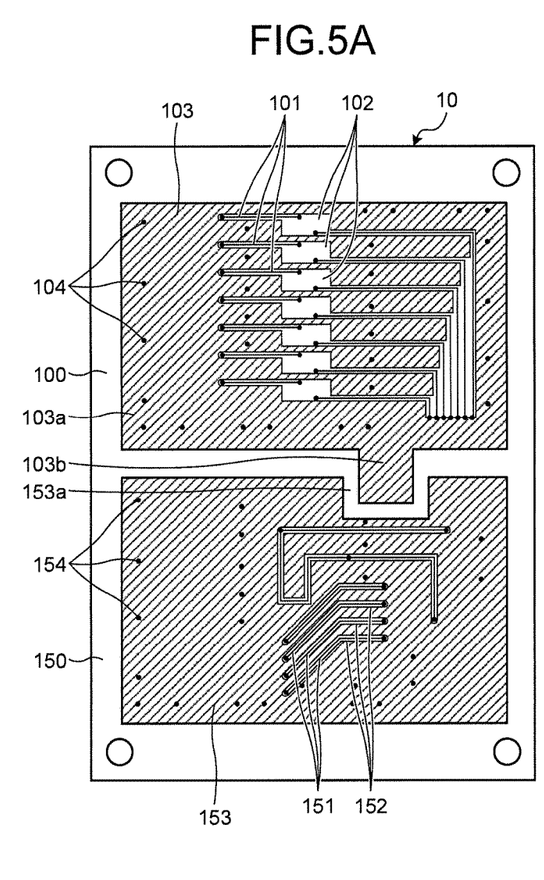
FIG. 5A and FIG. 5B are plan views of a circuit board of a voltage detection unit as still another embodiment of the present invention (FIG. 5A is a plan view viewing a first-layer pattern from above, FIG. 5B is a plan view viewing a second-layer pattern from above)
Figure 5B:
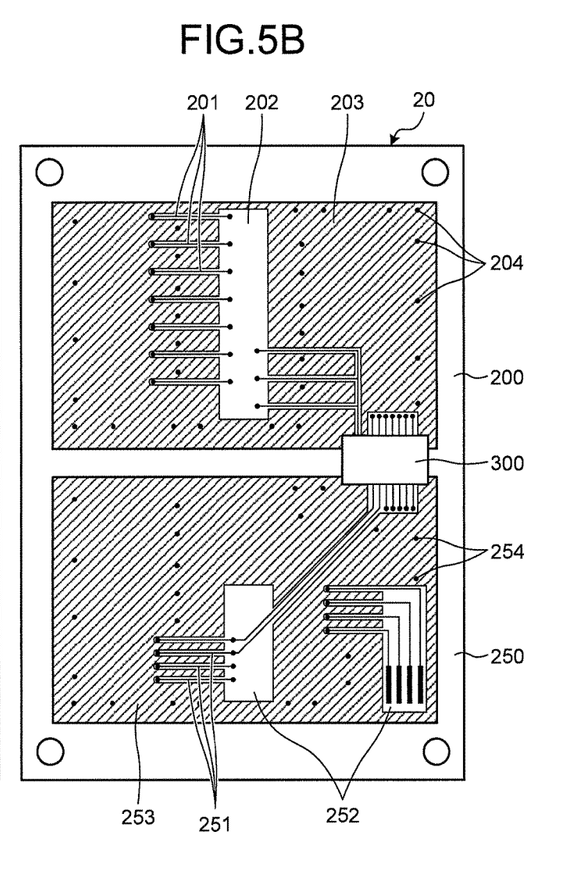

FIG. 5A and FIG. 5B are plan views of layers of a circuit board of a voltage detection unit as still another embodiment of the present invention: FIG. 5A is a plan view viewing a first-layer pattern from above; FIG. 5B is a plan view viewing a second-layer pattern from above.

As illustrated in FIG. 4A and FIG. 4B, the circuit 150 for low voltage of the pattern 10 is formed with a body ground connecting part 155 that is conductively connected to a vehicle's body ground in the solid pattern of the GND 153. The solid pattern extension 103b and the notch 153a are preferably provided near the body ground connecting part 155. With this arrangement, the capacitor C illustrated in FIG. 3 is ensured to have a more stable GND level. Consequently, the noise-resistant performance of the circuits 100 and 200 for high voltage can further be increased.

As illustrated in FIG. 5A and FIG. 5B, the solid pattern extension 103b and the notch 153a are preferably provided near the communication IC 300. With this arrangement, the solid pattern extension 103b and the notch 153a are preferably provided near the body ground connecting part 155. With this arrangement, the capacitor C illustrated in FIG. 3 can be disposed at a position closer to the communication IC 300 that radiates harmonic noise. Consequently, at a position close to a noise source, the noise is removed, and the noise is prevented from propagating widely on the circuits 100 and 200 for high voltage.

The embodiment describes a form in which the present invention is applied to the circuit board of a two-layer structure. The present invention can also be applied to a circuit board having a structure of three or more layers. When the present invention is applied to a circuit board of a three-layer structure including an upper layer, a middle layer, and a lower layer, for example, the solid pattern extension and the notch are provided in a GND of a pattern of the middle layer (or the upper layer and the lower layer), thereby capacitively coupling the GNDs between the upper layer and the middle layer and the GNDs between the middle layer and the lower layer. When the present invention is applied to a circuit board of a four-layer structure including a first layer to a fourth layer, for example, the solid pattern extension and the notch are provided in each GND of each pattern of the second layer and the third layer (or the first layer and the fourth layer), thereby capacitively coupling the GNDs between the first layer and the second layer and the GNDs between the third layer and the fourth layer.

Figure 6A:
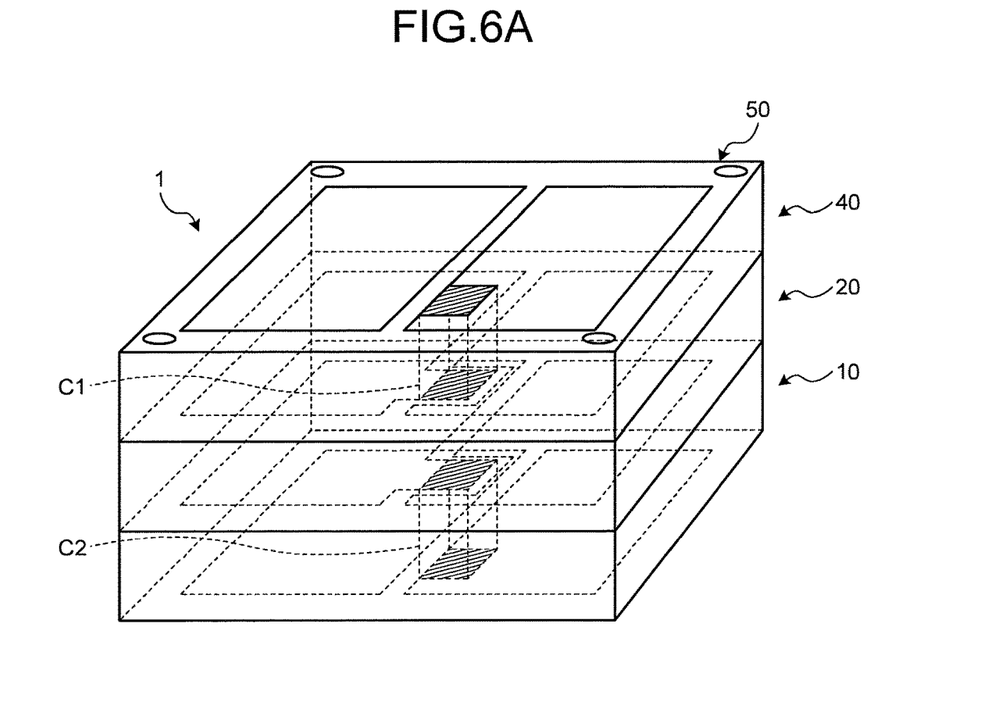
FIG. 6A and FIG. 6B are diagrams of a circuit board of a voltage detection unit as still another embodiment of the present invention (FIG. 6A is a perspective view, FIG. 6B is a sectional view at a section passing through a solid pattern extension)
Figure 6B:
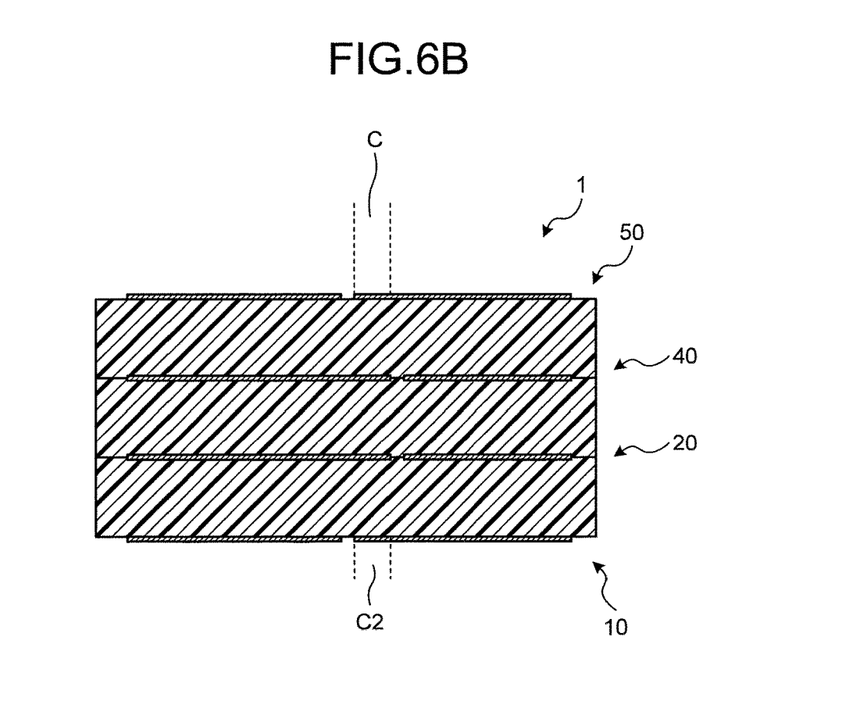

The following describes a form in which the present invention is applied to the circuit board of the four-layer structure in detail. FIG. 6A and FIG. 6B are diagrams of a circuit board of a voltage detection unit as still another embodiment of the present invention: FIG. 6A is a perspective view; FIG. 6B is a sectional view at a section passing through a solid pattern extension.

As illustrated in FIG. 6A and FIG. 6B, in the circuit board of the four-layer structure, the solid pattern extension and the notch are provided in each GND of a second-layer pattern 20 and a third-layer pattern 40, thereby capacitively coupling the GNDs between the first-layer pattern 10 and the second-layer pattern 20 and the GNDs between the third-layer pattern 40 and a fourth-layer pattern 50.

In FIG. 6A and FIG. 6B, the capacitive coupling occurring between the GNDs of the first-layer pattern 10 and the second-layer pattern 20 is expressed as C1, and the capacitive coupling occurring between the GNDs of the third-layer pattern 40 and the fourth-layer pattern 50 is expressed as C2. When the present invention is thus applied to the circuit board of the four-layer structure, capacitive coupling can occur between the respective layers. Consequently, the noise-resistant performance of the circuits 100 and 200 for high voltage can further be increased.

The embodiment describes a form in which one each of the circuit for high voltage and the circuit for low voltage are formed in one circuit board. The present invention can also be applied to a form in which a plurality of circuits for high voltage or a plurality of circuits for low voltage are formed in one circuit board. In this case, the solid pattern extension and the notch may be provided in GNDs of a circuit for high voltage and a circuit for low voltage that are adjacent to each other.

The embodiment describes a form in which the communication IC 300 is provided in the pattern 20. The communication IC 300 may be provided in the pattern 10.

The following [1] through [5] briefly summarize characteristics of the embodiment of the voltage detection unit according to the present invention.

[1] A voltage detection unit including:
a first pattern (10) formed with a pattern of a first circuit (100) for high voltage and a pattern of a first circuit (150) for low voltage; and
a second pattern (20) formed with a pattern of a second circuit (200) for high voltage and a pattern of a second circuit (250) for low voltage, wherein
the first pattern (10) and the second pattern (20) are stacked with each other,
in the pattern of the first circuit (100) for high voltage, a GND (103) is formed as a solid pattern except on parts formed with signal lines (101) and insulating parts (102),
in the pattern of the second circuit (250) for low voltage, a GND (253) is formed as a solid pattern except on parts formed with signal lines (251) and insulating parts (252), and
the solid pattern of the GND (103) of the pattern of the first circuit (100) for high voltage and the solid pattern of the GND (253) of the pattern of the second circuit (250) for low voltage partially face each other in a stacking direction in which the first pattern (10) and the second pattern (20) are stacked with each other.

[2] The voltage detection unit according to [1], in which
in the pattern of the first circuit (150) for low voltage, a GND (153) is formed as a solid pattern except on parts formed with signal lines (151) and insulating parts (152), and
in the pattern of the second circuit (200) for high voltage, a GND (203) is formed as a solid pattern except on parts formed with signal lines (201) and insulating parts (202).

[3] The voltage detection unit according to [2], in which
the pattern of the first circuit (100) for high voltage and the pattern of the second circuit (200) for high voltage are formed at positions facing each other in the stacking direction,
the pattern of the first circuit (150) for low voltage and the pattern of the second circuit (250) for low voltage are formed at positions facing each other in the stacking direction,
in the pattern of the first circuit (100) for high voltage, the solid pattern of the GND (103) includes a solid pattern body (103*a*) facing the pattern of the second circuit (200) for high voltage and a solid pattern extension (103*b*) extending from the solid pattern body (103*a*) toward the pattern of the first circuit (150) for low voltage,
in the pattern of the first circuit (150) for low voltage, the solid pattern of the GND (153) is formed with a notch (153*a*) inside which a part of the solid pattern extension (103*b*) is provided, and
the solid pattern extension (103*b*) of the pattern of the first circuit (100) for high voltage and the solid pattern of the GND (253) of the pattern of the second circuit (250) for low voltage partially face each other in the stacking direction.

[4] The voltage detection unit according to [3], in which
in the pattern of the first circuit (150) for low voltage, the solid pattern of the GND (153) includes a body ground connecting part (155) conductively connected to a body ground of a vehicle, and the notch (153*a*) is provided near the body ground connecting part (155).

[5] The voltage detection unit according to [3], further including a communication IC (300) that is disposed on the first pattern (10) or the second pattern (20) and is connected to signal lines of a pattern of a circuit for low voltage and signal lines of a pattern of a circuit for high voltage, in which the solid pattern extension (103*b*) is provided near the communication IC (300).

Although the above description does not refer to the capacitance of the capacitor formed by the solid pattern of the GND (103) of the pattern of the circuit (100) for high voltage and the solid pattern of the GND (253) of the pattern of the circuit (250) for low voltage facing the solid pattern of the GND (103), it can also be configured that not only the area of the facing solid patterns but also the capacitance of the capacitor is set in accordance with the frequency of the harmonic noise to be removed, thereby removing the harmonic noise more efficiently.

According to the present invention, the voltage detection unit can improve noise-resistant performance of the circuits for high voltage.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A voltage detection unit comprising: a first pattern formed with a pattern of a first circuit for high voltage and a pattern of a first circuit for low voltage;
and a second pattern formed with a pattern of a second circuit for high voltage and a pattern of a second circuit for low voltage, wherein the first pattern and the second pattern are stacked with each other, in the pattern of the first circuit for high voltage, a ground (GND) is formed as a solid pattern except on parts formed with signal lines and insulating parts, in the pattern of the second circuit for low voltage, a GND is formed as a solid pattern except on parts formed with signal lines and insulating parts, and the solid pattern of the GND of the pattern of the first circuit for high voltage and the solid pattern of the GND of the pattern of the second circuit for low voltage partially face each other in a stacking direction in which the first pattern and the second pattern are stacked with each other.

2. The voltage detection unit according to claim 1, wherein
in the pattern of the first circuit for low voltage, a GND is formed as a solid pattern except on parts formed with signal lines and insulating parts, and
in the pattern of the second circuit for high voltage, a GND is formed as a solid pattern except on parts formed with signal lines and insulating parts.

3. The voltage detection unit according to claim 2, wherein
the pattern of the first circuit for high voltage and the pattern of the second circuit for high voltage are formed at positions facing each other in the stacking direction,
the pattern of the first circuit for low voltage and the pattern of the second circuit for low voltage are formed at positions facing each other in the stacking direction,
in the pattern of the first circuit for high voltage, the solid pattern of the GND comprises a solid pattern body facing the pattern of the second circuit for high voltage and a solid pattern extension extending from the solid pattern body toward the pattern of the first circuit for low voltage,
in the pattern of the first circuit for low voltage, the solid pattern of the GND is formed with a notch inside which a part of the solid pattern extension is provided, and
the solid pattern extension of the pattern of the first circuit for high voltage and the solid pattern of the GND of the pattern of the second circuit for low voltage partially face each other in the stacking direction.

4. The voltage detection unit according to claim 3, wherein
in the pattern of the first circuit for low voltage, the solid pattern of the GND comprises a body ground connecting part conductively connected to a body ground of a vehicle, and the notch is provided near the body ground connecting part.

5. The voltage detection unit according to claim 3, further comprising:
a communication IC which is disposed on the first pattern or the second pattern and is connected to signal lines of a pattern of a circuit for low voltage and signal lines of a pattern of a circuit for high voltage, wherein
the solid pattern extension is provided near the communication IC.

* * * * *